United States Patent [19]
Yang et al.

[11] Patent Number: 5,981,985
[45] Date of Patent: *Nov. 9, 1999

[54] HETEROJUNCTION BIPOLAR TRANSISTOR WITH BURIED SELECTIVE SUB-COLLECTOR LAYER, AND METHODS OF MANUFACTURE

[75] Inventors: Yue-Fei Yang, New York; Edward S. Yang, Armonk, both of N.Y.

[73] Assignee: The Trustees of Columbia University in the City of New York, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/669,113

[22] Filed: Jun. 24, 1996

[51] Int. Cl.$^6$ .......................... H01L 29/41; H01L 29/737
[52] U.S. Cl. .......................... 257/198; 257/586; 257/773
[58] Field of Search .................................. 257/197, 198, 257/593, 586, 773

[56] References Cited

U.S. PATENT DOCUMENTS

| | | | |
|---|---|---|---|
| 5,140,399 | 8/1992 | Kawai | 257/197 |
| 5,286,997 | 2/1994 | Hill | 257/586 |
| 5,508,536 | 4/1996 | Twynam et al. | 257/197 |

OTHER PUBLICATIONS

M.R. Frei et al., "Selective Growth of InGaAs/InP Heterojunction Bipolar Transistors With a Buried Subcollector," Appl. Phys. Lett 61, 1992, pp. 1193–1195.

M. Ho et al., "High Performance Low–Base–Collector Capacitance AlGaAs/GaAs Heterojunction Bipolar Transistors . . . ", IEEE Electron Device Letters 16, 1995, pp. 512–514.

*Primary Examiner*—Jerome Jackson, Jr.
*Attorney, Agent, or Firm*—Baker & Botts, L.L.P.

[57] ABSTRACT

In an integrated heterojunction bipolar transistor (HBT) with minimized base-collector capacitance, a sub-collector region is formed as a mesa on a substrate, a collector contact is to the sub-collector mesa region, a lightly-doped collector region and a base region extend from the mesa onto the substrate, and a base contact and its via hole for interconnection are off the mesa, with minimal overlap with the sub-collector region. The latter may be termed a buried selective sub-collector (BSSC) region. Such transistors can be used as integrated switching devices and microwave devices, e.g., in wireless communications, satellite direct broadcast systems, automobile collision avoidance systems, global positioning systems, and other high-frequency applications.

7 Claims, 3 Drawing Sheets

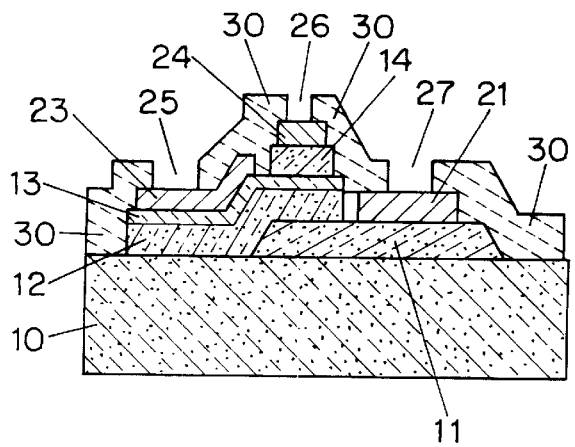
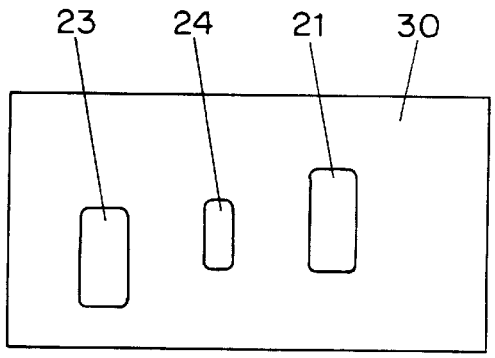
FIG. 15        FIG. 16
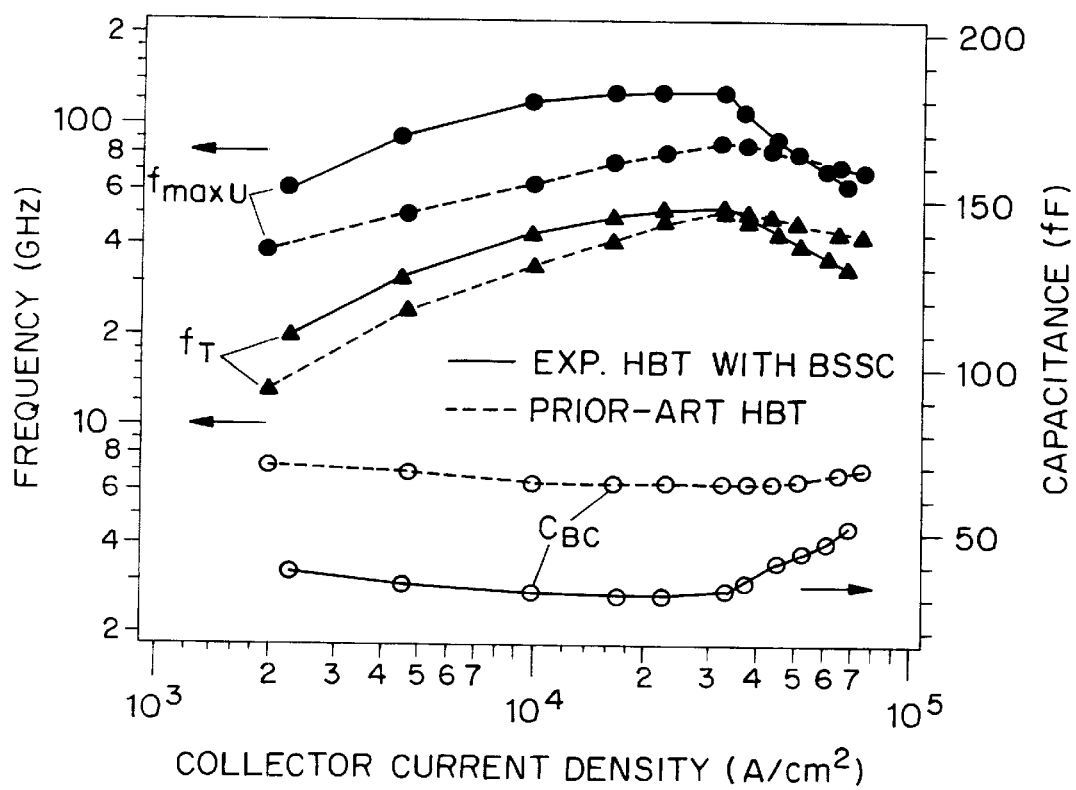
FIG. 17

HETEROJUNCTION BIPOLAR TRANSISTOR WITH BURIED SELECTIVE SUB-COLLECTOR LAYER, AND METHODS OF MANUFACTURE

The United States Government has certain rights in this invention pursuant to awards identified as NSF#ECS-93-19987 and JSEP(Army)#DAAH04-94-G-0057.

TECHNICAL FIELD

The invention relates to heterojunction bipolar transistor structures and their manufacture.

BACKGROUND OF THE INVENTION

Largely on account of their high speed, high current driving capability and low 1/f noise, heterojunction bipolar transistors (HBTs) are being used as integrated switching devices and microwave devices, e.g., in wireless communications, satellite direct broadcast systems, automobile collision avoidance systems, global positioning systems, and other high-frequency applications.

An HBT can be formed, e.g., at a surface of a semi-insulating gallium arsenide substrate, with a heavily silicon-doped (n-type) sub-collector gallium arsenide layer on the substrate, a lightly silicon-doped (n-type) gallium arsenide collector layer on the sub-collector layer, a carbon-doped (p-type) gallium arsenide base layer on the collector layer, a silicon-doped (n-type) aluminum gallium arsenide emitter layer on the base layer, and with metallic contacts to the emitter, base and sub-collector layers. Conventionally, the base contact metal, having an area which is greater than the emitter area, overlaps with the sub-collector layer. This overlap contributes a major share of the extrinsic base-collector capacitance, towards the total base-collector capacitance. Such an HBT structure is disclosed in U.S. Pat. No. 5,286,997, issued Feb. 15, 1994 to D. Hill.

High-frequency performance of HBTs, in microwave applications, requires reduced extrinsic base-collector capacitance. To this end, M. R. Frei et al., "Selective Growth of InGaAs/InP Heterojunction Bipolar Transistors with a Buried Subcollector", *Applied Physics Letters* 61, 1992, pp. 1193–1195 discloses selective growth of a buried sub-collector having minimized overlap with the base contact layer. However, this technique has been found difficult to implement in practice.

Another known technique for reducing the extrinsic base-collector capacitance makes use of hydrogen ion implantation into the sub-collector layer, as disclosed by M.-C. Ho et al., "High-Performance Low-Base-Collector Capacitance AlGaAs/GaAs Heterojunction Bipolar Transistors Fabricated by Deep Ion Implantation", *IEEE Electron Device Letters* 16, 1995, pp. 512–514. Since ion implantation is through the base contact region, the base resistance is increased in the process, which tends to degrade the microwave performance.

SUMMARY OF THE INVENTION

In the interest of ease of manufacture of an integrated HBT with minimized base-collector capacitance, the sub-collector region is formed as a mesa on a substrate, the collector contact is to the sub-collector mesa region, a lightly-doped collector region and a base region extend from the mesa onto the substrate, and the base contact and its via hole for interconnection are off the mesa, with minimal overlap with the sub-collector region. An emitter region with emitter contact is on the base region between the base and collector contacts.

Advantageously in the new technique, minimization of the base-collector capacitance does not entail an increase of the base resistance. As a result, which is significant for microwave devices, the maximum oscillation frequency is increased as compared with prior-art devices.

BRIEF DESCRIPTION OF THE DRAWING

FIGS. 1–16 are schematics which illustrate manufacturing stages in a preferred method embodiment of the invention. Odd-numbered figures are cross sections; even-numbered figures are top views corresponding to the respective preceding odd-numbered figures. FIGS. 15 and 16 also illustrate the structure of an HBT in accordance with a preferred device embodiment of the invention.

FIG. 17 is a plot of cutoff oscillation frequency ($f_T$), maximum oscillation frequency ($f_{maxU}$), and base-collector capacitance ($C_{BC}$) as a function of collector-current density for an HBT in accordance with an exemplary embodiment of the invention (BSSC, buried selective sub-collector) as compared with a prior-art device, at a collector-emitter bias of 2 V.

DETAILED DESCRIPTION OF PREFERRED EMBODIMENTS

Figure 1:
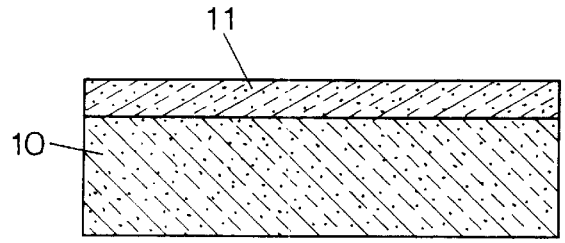

Exemplary features in FIGS. 1–16 are as follows: a semi-insulating gallium arsenide substrate 10, an $n^+$-type gallium arsenide sub-collector layer 11 with contact 21, an n-type gallium arsenide collector layer 12, a $p^+$-type gallium arsenide base layer 13 with contact 23, an n-type gallium indium phosphide emitter layer with an n-type gallium arsenide emitter cap layer in combination 14, an emitter contact 24, a dielectric material 30 such as silicon dioxide or polyimide, and a base via hole 25, an emitter via hole 26 and a collector via hole 27.

Figure 2:
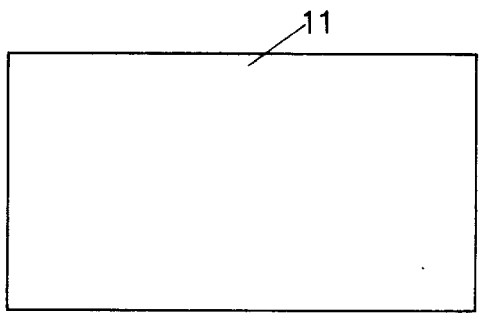
Figure 3:
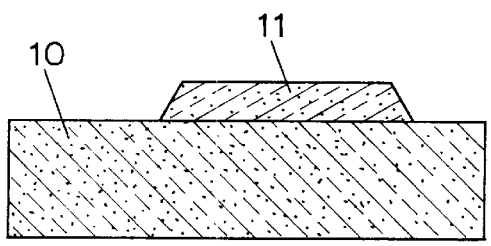
Figure 4:
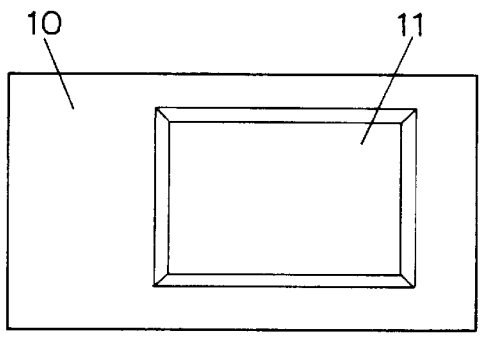
Figure 5:
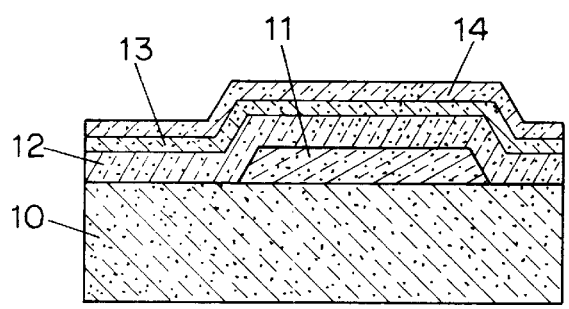
Figure 6:
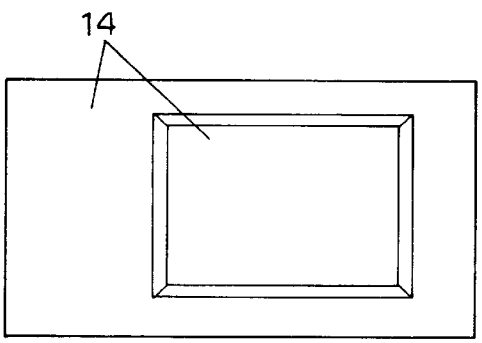

FIGS. 1–16 illustrate consecutive stages in the fabrication of the exemplary device embodiment. Specific process steps are as follows:

On the substrate 10, a doped sub-collector layer 11 is epitaxially grown, e.g., by metal-organic chemical vapor deposition (MOCVD); see FIGS. 1 and 2. The sub-collector mesa is defined by conventional photolithography and formed by etching; see FIGS. 3 and 4. After mesa formation, the sample is cleaned by a conventional wet or dry method, and the collector layer 12, the base layer 13 and the emitter layer 14 are grown by MOCVD, for example; see FIGS. 5 and 6.

Figure 7:
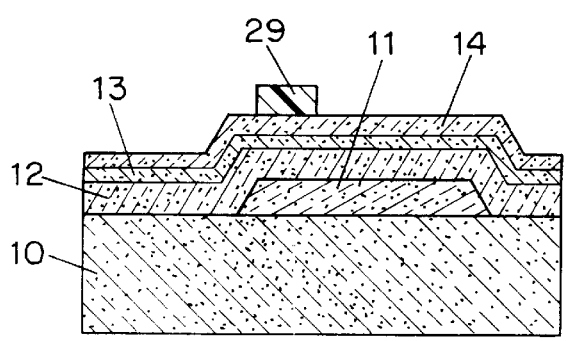
Figure 8:
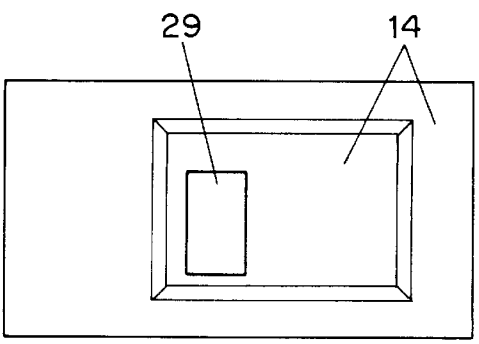
Figure 9:
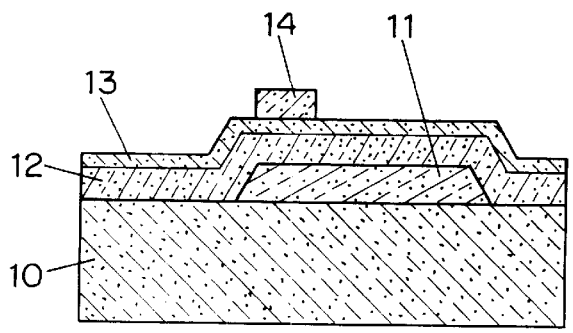
Figure 10:
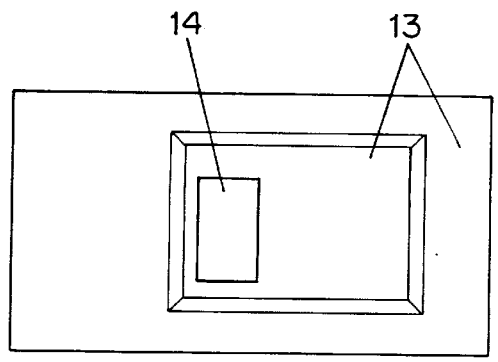

A photoresist 29 is used to define the emitter mesa at a corner of the sub-collector mesa as shown in FIGS. 7 and 8. The emitter mesa is formed, and the base layer 13 is exposed by suitable etching; see FIGS. 9 and 10.

Figure 11:
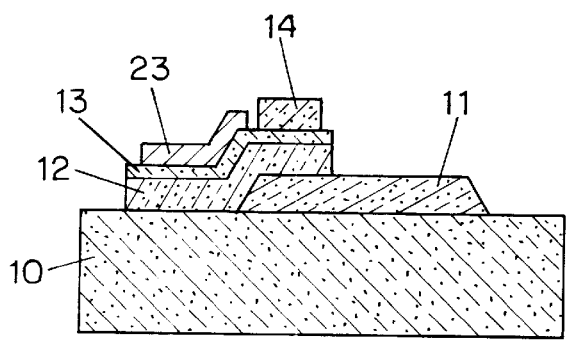
Figure 12:
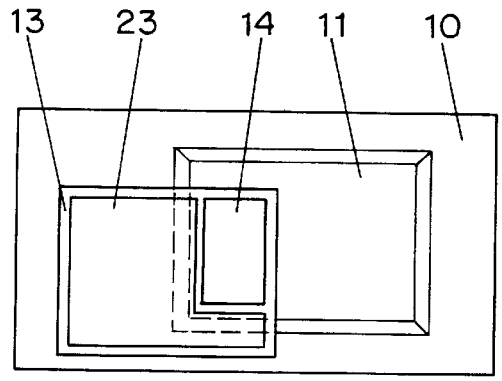

The base contact metal 23 is formed, e.g., by metal deposition and lift-off, self-aligned or non-self-aligned. As preferred, all or most of the base contact area is off the sub-collector mesa. Preferably for minimizing base resistance, the base contact metal 23 extends onto the sloping portion of the sub-collector mesa as shown in FIGS. 11 and 12, but without reaching to the level portion of the sub-collector mesa.

Further for reducing the base resistance, the base contact metal 23 may surround the emitter mesa. Still in this case, the area of the base contact metal 23 used for interconnection, such as the via hole 25 in the dielectric layer 30 is off the sub-collector mesa.

After base contact metal formation, the base mesa is formed by etching the base layer 13 and the collector layer 12 with photoresist or base contact metal as a mask. This results in exposure of parts of the sub-collector layer 11 and the substrate 10; see FIGS. 11 and 12.

Figure 13:
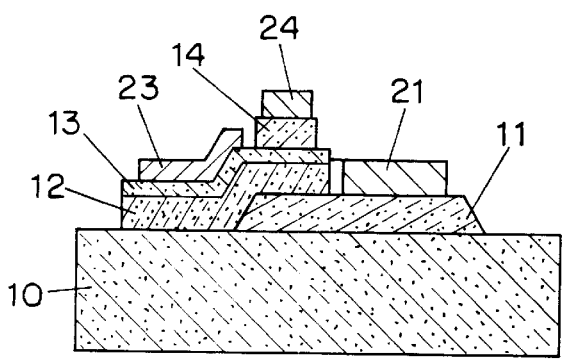
Figure 14:
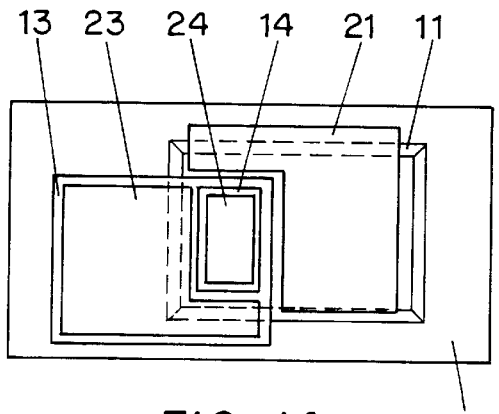

The emitter contact metal 24 and the collector contact metal 21 are formed by photolithography, metal deposition and lift-off; see FIGS. 13 and 14.

In an alternative embodiment in forming the emitter contact metal 24 and the emitter mesa, the emitter contact metal 24 is formed first, and the emitter mesa is formed by etching with the emitter contact metal 24 as a mask.

A dielectric layer 30, of silicon dioxide or polyimide, for example, is deposited for interconnection isolation. The via hole 25 of the base contact, the via hole 26 of the emitter contact, and the via hole 27 of the collector contact are opened. In the resulting device as shown in FIGS. 15 and 16, the base contact via hole 25 is off the mesa 11. Second-metal interconnects of the emitter, base and collector are formed conventionally.

An experimental GaInP/GaAs npn-HBT having the structure described above was made with an emitter area of 4 micrometers by 12 micrometers. Layer thicknesses and dopant concentrations were as follows: 400 nanometers and $4 \cdot 10^{18}$ Si/cm$^3$ for the sub-collector layer 11, 500 nanometers and $3 \cdot 10^{16}$ Si/cm$^3$ for the collector layer 12, 100 nanometers and $6 \cdot 10^9$ C/cm$^3$ for the base layer 13, 50 nanometers and $3 \cdot 10^{17}$ Si/cm$^3$ for the emitter layer, and 150 nanometers and $4 \cdot 10^{18}$ Si/cm$^3$ for the emitter cap layer. The contact metal was $Au_{0.8}Ge_{0.2}$ for the emitter and the collector, and $Au_{0.9}Zn_{0.1}$ for the base.

The experimental HBT was found to have a collector capacitance of about one-half as compared with a prior art device. Optimally or near-optimally, current gain was about 40, cutoff frequency was 50 GHz, and maximum oscillation frequency was 140 GHz. As compared with the prior-art device, the improvement of the maximum oscillation frequency is about 40–50%. See FIG. 17 for a detailed comparison as a function of collector-current density.

The following are among semiconductor material systems further to GaInP/GaAs in which preferred structures can be implemented: AlGaAs/GaAs, AlInAs/InGaAs/InP, InP/GaInAs, InP/GaAsSb/InP, AlInAs/GaAsSb/InP, Si/SiGe and GaN/SiC.

We claim:

1. A heterojunction bipolar transistor structure on a substrate, comprising:

a relatively heavily doped mesa sub-collector region on the substrate, having a level portion delimited by a sloping portion;

a relatively lightly doped collector region in part on the mesa sub-collector region and in part on the substrate;

a relatively heavily doped base region on the collector region;

an emitter region on a portion of the base region which overlies the mesa sub-collector region;

collector, base and emitter contacts to the sub-collector, base and emitter regions, respectively; and a dielectric region with via holes to the contacts;

wherein the base contact overlies the collector region and the sloping portion of the mesa sub-collector region, but is off the level portion of the mesa sub-collector region and the via hole to the base contact is off the mesa sub-collector region.

2. The heterojunction bipolar transistor structure of claim 1, wherein the base contact surrounds a portion of the emitter mesa.

3. The heterojunction bipolar transistor structure of claim 1, wherein the sub-collector and collector regions are n-type, the base region is p-type, and the emitter region is n-type.

4. The heterojunction bipolar transistor structure of claim 1, wherein the sub-collector region is n-type, the collector region is intrinsically doped, the base region is p-type, and the emitter region is n-type.

5. The heterojunction bipolar transistor structure of claim 1, wherein the sub-collector and collector regions are p-type, the base region is n-type, and the emitter region is p-type.

6. The heterojunction bipolar transistor structure of claim 1, wherein the sub-collector region is p-type, the collector region is intrinsically doped, the base region is n-type, and the emitter region is p-type.

7. The heterojunction bipolar transistor structure of claim 1, implemented in a material system selected from the group consisting of AlGaAs/GaAs, GaInP/GaAs, AlInAs/InGaAs/InP, InP/GaInAs, InP/GaAsSb/InP, AlInAs/GaAsSb/InP, Si/SiGe and GaN/SiC.

* * * * *